(12) United States Patent
Mouli et al.

(10) Patent No.: US 6,190,996 B1
(45) Date of Patent: Feb. 20, 2001

(54) METHOD OF MAKING AN INSULATOR FOR ELECTRICAL STRUCTURES

(75) Inventors: Chandra V. Mouli; Fernando Gonzalez, both of Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/365,659

(22) Filed: Aug. 2, 1999

Related U.S. Application Data

(62) Division of application No. 08/969,208, filed on Nov. 12, 1997.

(51) Int. Cl.[7] .................................................. H01L 21/76
(52) U.S. Cl. ........................ 438/400; 438/421; 257/522
(58) Field of Search ................................. 438/400, 305, 438/421; 257/411, 522; 156/643; 357/54, 49; 351/49, 54

(56) References Cited

U.S. PATENT DOCUMENTS

| | | | |
|---|---|---|---|
| 4,638,347 | * 1/1987 | Iyer ........................................ | 357/54 |
| 4,735,680 | * 4/1988 | Yen ....................................... | 156/643 |
| 5,126,817 | * 6/1992 | Baba et al. ............................. | 357/49 |
| 5,324,683 | * 6/1994 | Fitch et al. ............................ | 438/400 |
| 5,338,975 | 8/1994 | Cole, Jr. et al. ...................... | 257/750 |
| 5,369,297 | * 11/1994 | Kusunoki et al. ................... | 257/411 |
| 5,516,720 | 5/1996 | Lur et al. ............................... | 437/67 |
| 5,599,745 | 2/1997 | Reinberg .............................. | 437/195 |
| 5,736,446 | * 4/1998 | Wu ........................................ | 438/305 |
| 5,766,969 | * 6/1998 | Fulford, Jr. et al. ................ | 438/305 |
| 5,770,507 | * 6/1998 | Chen et al. ........................... | 438/305 |
| 5,770,508 | * 6/1998 | Yeh et al. ............................. | 438/305 |
| 5,783,475 | * 7/1998 | Ramaswami ......................... | 438/305 |
| 5,914,519 | * 6/1998 | Chou et al. ........................... | 438/305 |
| 5,915,182 | * 6/1999 | Wu ........................................ | 438/305 |
| 5,920,783 | * 6/1998 | Tseng et al. .......................... | 438/305 |
| 5,972,763 | * 12/1998 | Chou et al. ........................... | 438/305 |

FOREIGN PATENT DOCUMENTS 129664    11/1989 (JP) ..................................... 257/410

OTHER PUBLICATIONS

Togo, et al. "A Gate–side Aip–gap Structure (GAS) to Reduce the Parasitic Capacitance in MOSFET's," 1996 Symposium of VLSI Technology, Digest of Technical Papers, pp. 38–39.

* cited by examiner

*Primary Examiner*—Charles Bowers
*Assistant Examiner*—David S Blum
(74) *Attorney, Agent, or Firm*—Workman, Nydegger, Seeley

(57) ABSTRACT

Structures and methods are disclosed for insulating a polysilicon gate adjacent to an electrically active region with a silicon base layer. A layer of silicon nitride having a thickness in a range from about 100 Å to about 150 Å is conformally deposited over the polysilicon gate. A layer of silicon dioxide is formed over the layer of silicon nitride on the polysilicon gate. The layer of silicon dioxide is subjected to a spacer etch to form spacers upon the layer of silicon nitride and on lateral sidewalls of the polysilicon gate. A portion of the layer of silicon nitride situated between the polysilicon gate and the spacer is removed by an etching process that is selective to silicon dioxide and to polysilicon. The etch forms a recess defined between the polysilicon gate and each respective spacer. A cover layer is formed to close an opening to the recess so as to enclose a void therein. Alternatively, the etch can be a series of selective etches that extends the recess into the silicon base layer, after which the silicon base layer is implanted so that the recess isolate, electrically active areas in the silicon base layer. A void is then enclosed below the opening to the recess within the silicon base layer by a cover layer deposited nonconformally thereover.

55 Claims, 8 Drawing Sheets

METHOD OF MAKING AN INSULATOR FOR ELECTRICAL STRUCTURES

This application is a divisional of U.S. patent application Ser. No. 08/969,208, filed on Nov. 12, 1997, which is incorporated herein by reference.

BACKGROUND OF THE INVENTION

1. The Field of the Invention

The present invention relates to electrical insulators for active elements such as transistors, capacitors, resistors, and diodes. In particular, the present invention relates to such active elements and methods of improving the performance thereof by reducing parasitic effects of capacitance therein by electrical insulation structures and techniques for making the same.

2. The Relevant Technology

Integrated circuits provide the logic and memory of computers and other intelligent electronic products. Electronic "chips" on which the integrated circuits are situated have advanced in capability to a level that has made computers and other intelligent electronic devices highly functional. Integrated circuits are also being manufactured economically, allowing the highly functional computers and other intelligent electronic products to be provided to consumers at an affordable cost.

Integrated circuits are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

Conventional semiconductor devices which are formed on a semiconductor substrate include capacitors, resistors, transistors, diodes, and the like. In advanced manufacturing of integrated circuits, hundreds of thousands of these semiconductor devices are formed on a single semiconductor substrate.

The computer and electronics industry is constantly under market demand to increase the speed at which integrated circuits operate, to increase the capabilities of integrated circuits, and to reduce the cost of integrated circuits. One manner of accomplishing this task is to increase the density with which the semiconductor devices can be formed on a given surface area of a single semiconductor substrate. In so doing, the semiconductor devices must be decreased in dimension in a process known as miniaturization. In order to meet market demands and further the miniaturization of integrated circuits, the processes by which the semiconductor devices are formed are in need of improvement. The challenge in miniaturizing integrated circuits is to do so without greatly increasing the cost of the processes by which integrated circuits are manufactured. Accordingly, the new processes must also be relatively simple and cost effective.

One structure which is frequently formed in integrated circuit manufacturing and for which improved methods of formation are needed is the MOS transistor. The MOS transistor has source/drain regions and a gate.

MOS transistor performance is a contemporary concern. Relating to performance are the criteria of how much drive capability the transistor has and how much current can drive through the transistor. The capacitance of a transistor slows down the transistor and may slow down a circuit of which the transistor forms a part. The capacitance loading of a transistor is the charge that needs to accumulate in the transistor before the transistor conducts charge in the channel between source/drain regions.

Fringing capacitance is part of the gate-to-source/drain capacitance and is dependent upon the thickness of a spacer surrounding the gate of the transistor, where the spacer extends from a lateral side of the gate to the source/drain regions, and upon the ion implanted doping profile of the source/drain regions. Fringing capacitance has a parasitic effect on the transistor. It is desirable to reduce the fringing capacitance because fringing capacitance adds loading to the logic gates.

In conventional MOS transistor fabrication flow, a layer of conductive material, such as polysilicon, is deposited upon a relatively thin gate oxide layer and is patterned and etched to form a transistor gate. Following this, a reoxidation step of the gate is performed to grow a thermal oxide so as to smooth corners around the gate. The reoxidation step also increases the oxide thickness near the gate as well as at a selected location where the source/drain regions are to be formed, while reducing the peak electric field in the underlying substrate in those regions. Consequently, hot-carrier effects will be suppressed. A low/medium dose ion doping implant is performed. A layer material is then deposited, typically an oxide or a nitride, which is then subjected to a spacer etch to form a spacer around sidewalls of the gate. The spacer is typically about 1000 Å thick, In this sequence of processing, the spacer dielectric is in direct contact with the gate sidewall. Heavy dose source/drain implants follow to form the source/drain regions proximal to the spacer.

Attempts have been made to reduce transistor fringing capacitance in the MOS transistor. Where the MOS transistor has a spacer extending from a lateral side of the gate to the source/drain regions, fringing capacitance is determined by the relative dielectric constant of the spacer material. Typically, the spacer is composed of a material having a low dielectric constant of about 2.3. Silicon dioxide or silicon nitride can be used to form the spacer, which have dielectric constants of about 3.5 and about 7.5. respectively. In contrast, air and a vacuum have dielectric constants of about 1.1 and 1.0 respectively. It would be desirable to lower the dielectric constant of the spacer material to reduce the fringing capacitance.

Other attempts have been made to reduce the fringing capacitance by minimizing the size of the spacer surrounding the gate of the transistor, either alone or in combination with reducing the distance that the source/drain regions protrude underneath the gate. Such reductions, however, may yield a spacer having less structural integrity.

What is needed are methods and structures to increase MOS transistor performance, drive current and capacity by reducing the loading and fringing capacitance thereof without reducing spacer structural integrity.

SUMMARY OF THE INVENTION

In accordance with the invention as embodied and broadly described herein, it is an application thereof to reduce fringe capacitance in active elements of integrated circuits, including by way of example and not limitation, transistors, diodes, capacitors, and resistors. To accomplish a device and method of making the same which overcomes the foregoing prior art problems and disadvantages, there is provided an electrically insulated structure having, a semiconductor substrate with a raised feature projecting therefrom. A void is formed between the raised feature and a cover layer. The void is preferably substantially closed off from the ambient by a cap formed over an opening thereto. The cap can be situated over the opening so as to close the void, and can be upon both the raised feature and the cover layer. The void can be used as an electrical insulator when formed between and adjacent to electrically conductive regions, such as the gate and source/drain regions of a transistor. The void can also act as an insulator when situated between the components of capacitors. resistors, and diodes. The void is a preferred insulator in that, when filled with air, the void has a dielectric constant of about one (1).

A method for producing the electrically insulated structure is provided by forming a raised feature projecting from a semiconductor substrate, forming a layer of a primary material over the raised feature, and forming a layer of a secondary material over the layer of the primary material. Next, a recess is formed in the primary material and situated between the layer of the secondary material and the raised feature. There is then formed a cover layer over an opening to the recess so as to form a void.

To form the recess described above, a selective removal process, such as an etch, can be used. The selective removal process removes the primary material situated in between the raised feature and the secondary material at a faster material removal rate than the material removal rate of either the secondary material or the material of the raised feature. In the case of an etch, a wet etch, dry etch, or combined wet and dry etch processes can be performed.

A masking step can be formed performed to form the recess described above, where the mask protects the secondary material, but leaves exposed to a selective removal process the primary material situated in between the raised feature and the secondary material. The selective removal process then removes the primary material situated in between the raised feature and the secondary material at a faster material removal rate than the material removal rate of either the secondary material or the material of the raised feature.

The void can be used to electrically isolate electrically conductive features. For example the void can be confined between a spacer and a side wall of a gate of a MOS transistor. Alternatively, the void can be formed within of a shallow trench situated within an semiconductor substrate and in between and isolating electrically active regions within the semiconductor substrate, such as between diodes.

Additional advantages of the invention will be set forth in the description which follows, and in part will be obvious to those skilled in the art after referring to the following description, or may be learned by the practice of the invention. The advantages of the invention may be realized and obtained by means of the combinations particularly pointed out in the appended claims.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to a structure for improving the performance of a metal oxide semiconductor (MOS)

transistor. Particularly, the present invention reduces the parasitic effect of fringing capacitance from the gate of the MOS transistor to the source/drain regions of the transistor. The parasitic effect of fringing capacitance is reduced using the dielectric characteristics of a void within a spacer on the sidewall of the gate of the MOS transistor to electrically insulate the gate. Methods of making the structure are also disclosed. In general, the invention contemplates an etch process that will not be selective to a material conformally formed on the gate and that will be selective to a material deposited over the material conformally formed on the gate.

Figure 1:
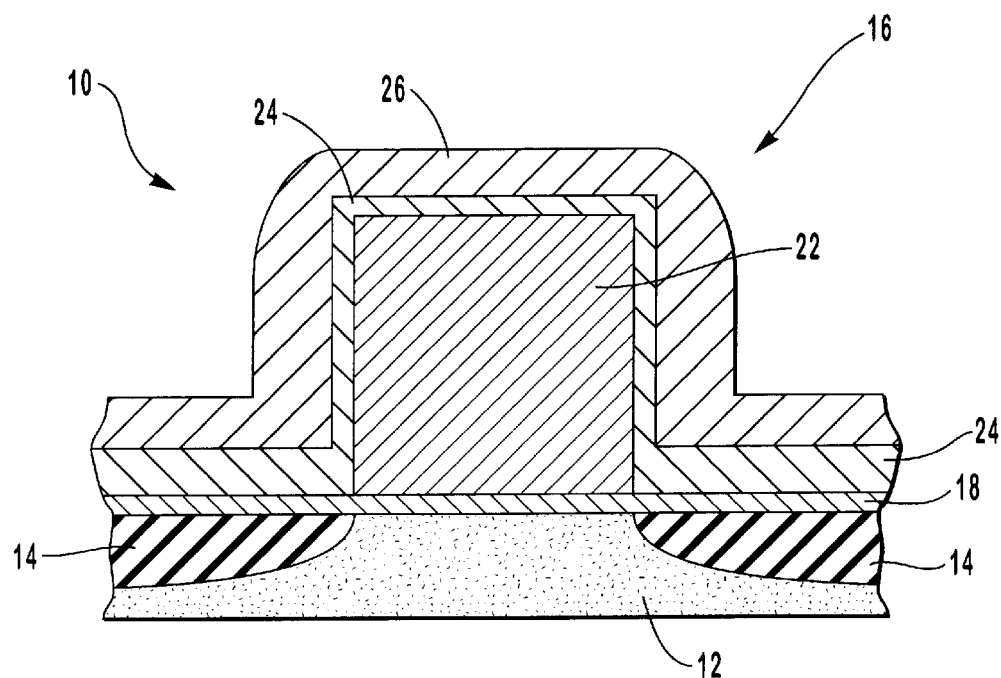
FIG. 1 is a partial cross-sectional elevation view of a semiconductor substrate showing a gate stack on a silicon base layer adjacent to a source/drain region formed within the silicon base layer with a layer of silicon nitrite and a layer of electrically insulated material formed thereover.

A structure 10 is formed with a silicon base layer 12 as shown in FIG. 1. Silicon base layer 12 can be a silicon wafer, or any type of semiconductor substrate may be used, including silicon on insulator (SIO), silicon on sapphire (SOS), and the like.

Overlaying silicon base layer 12 is a gate oxide layer 18. Gate oxide layer 18 may be relatively thin in comparison with the other layers depicted in FIG. 1. A structure projecting from semiconductor substrate 10, such as a gate stack, is generally seen at reference number 16. Gate layer 22 is substantially composed of an electrically conductive material. It is preferred that gate layer 22 is substantially composed of polysilicon. Although one gate stack 16 is illustrated, any number of gate stacks 16 may be formed. Source/drain regions 14 are defined adjacent to gate stack 16.

A layer of primary material 24 is formed over gate stack 16 and semiconductor substrate 10. Layer of primary material 24 is substantially composed of a dielectric material. Preferably, layer of primary material 24 is substantially composed of silicon nitride and has a thickness in the range of about 100 Å to about 150 Å.

A layer of secondary material 26 is deposited conformally over layer of primary material 24 on gate layer 22 and silicon base layer 12. Layer of secondary material 26 can be substantially composed of a dielectric material, such as silicon dioxide or silicon nitride, in which case the dielectric material will preferably have a low dielectric constant (k). In other embodiments, layer of secondary material 26 can be substantially composed of an electrically conductive material, such as polysilicon. It is preferred, however, that layer of secondary material 26 be substantially composed of a material that differs from that of layer of primary material 24.

Figure 2:
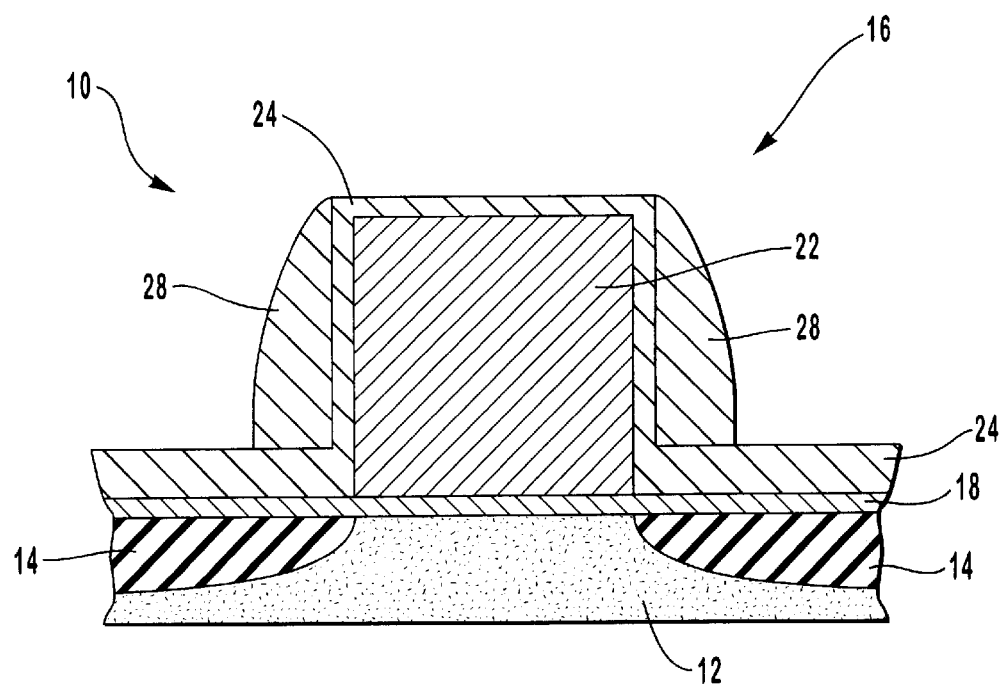
FIG. 2 is a partial cross-sectional elevation view of the structure of FIG. 1 with spacer on the gate stack that is formed from the layer of electrically insulated material.

A spacer 28 seen in FIG. 2 is formed by a spacer etch upon layer of secondary material 26 seen in FIG. 1. The etchant used during the spacer etch is selective to layer of primary material 24 and the spacer etch exposes layer of primary material 24 on top of gate stack 16. Spacer 28 is generally perpendicular to silicon base layer 12. Where layer of primary material 24 is substantially composed of silicon nitride, spacer 28 will preferably not also be substantially composed of silicon nitride. Spacer 28 can also be formed by processes other methods of selectively removing a portion of said layer of secondary material 26 without effecting the intended function thereof. Two (2) spacers 28 are seen in FIG. 2, one being on each sidewall of gate layer 22.

Figure 3A:
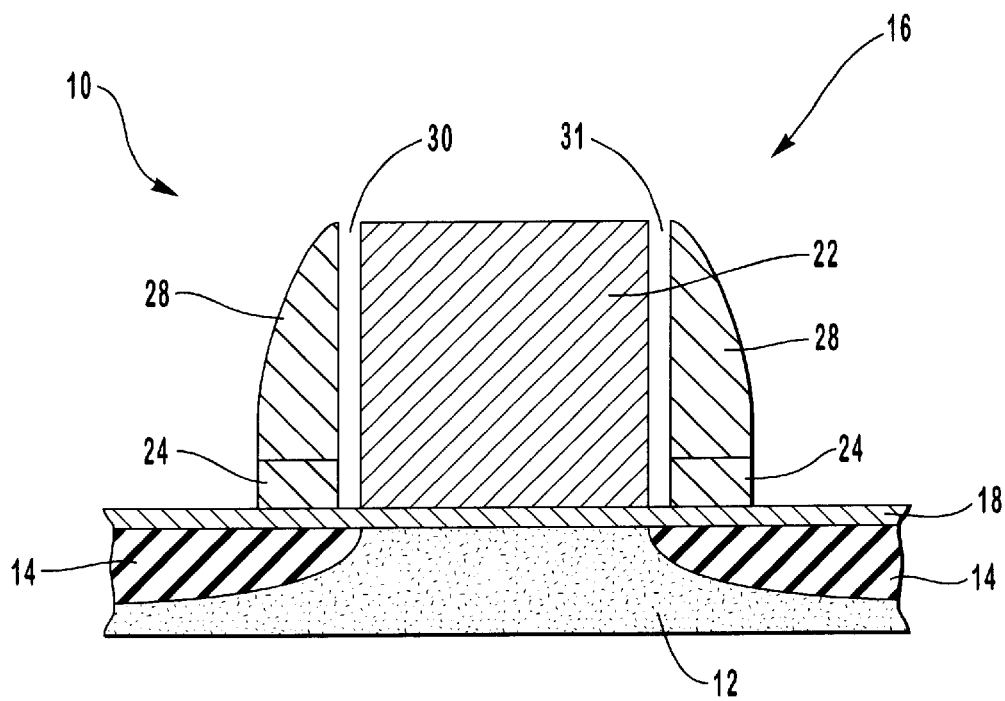
FIG. 3A is a partial cross-sectional elevation view of the structure of FIG. 2 after an etch creating a recess between the gate stack and the spacer.

As shown in FIG. 3A, a recess 30 is formed between gate layer 22 and each spacer 28. Preferably, recess 30 isolates spacer 28 from gate layer 22. There are a variety of methods that can be used to create recess 30 between gate layer 22 and each spacer 28. A first preferred method of creating recess 30 is to perform a dry etch on layer of primary material 24 that is selective to the material of layer of secondary material 26 and gate oxide layer 18. It is preferable that the dry etch be an anisotropic dry etch so that the etching process does not undercut spacer 28. Undercutting spacer 28 weakens its attachment to gate oxide layer 18. The dry etch creates recess 30 by anisotropically etching layer of secondary material 26 substantially parallel to the substantially vertical sidewalls of gate layer 22. As a result, gate oxide layer 18, gate layer 22, and spacer 28 are substantially unremoved while layer of primary material 24 is removed at a substantially faster rate.

Figure 3B:
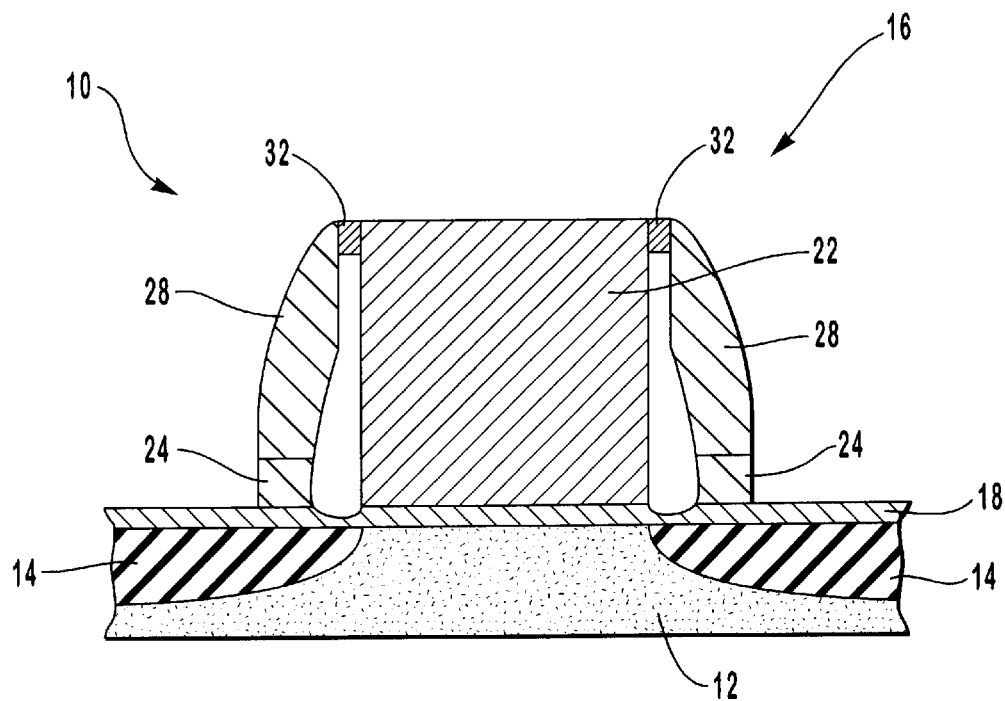
FIG. 3B is a partial cross-sectional elevation view of the structure of FIG. 2 after an etch creating a recess between the gate stack and the spacer, and also showing the recess closed by forming a cover layer using a reoxidation process.

An alternate way of forming recess 30 is seen in FIG. 3B. Recess 30 in FIG. 3B is formed using an isotropic wet etch. In this embodiment, the wet etch is selective to polysilicon of gate layer 22, and to the silicon dioxide which makes up gate oxide layer 18 and spacer 28. The wet etch, however, is not selective to layer of primary material 24 which is preferably substantially composed of silicon nitride. The isotropic wet etch has a higher material removal rate for layer of primary material 24 than that of gate layer 22, spacer 28 and gate oxide layer 18.

Spacer 28 is somewhat undercut remote from gate layer 22 by the wet etch. In addition, using a wet etch to form recess 30 is not as effective as an anisotropic dry etch because recess 30 will not extend all the way to gate oxide layer 18 when the wet etch is complete. After the wet etch, there is still usually a portion of layer of primary material 24 remaining at the bottom of recess 30.

In formation of recess 30 seen in FIG. 3B, it is preferable that the etching process used be a combination of a polymer promoting etch and a non-polymer promoting etch. The polymer promoting etch is preferably selective to gate layer 22, spacer 28, and gate oxide layer 18, while not being selective to layer of primary material 24. The etch has two stages. In one stage, the etch process will etch horizontally exposed surfaces faster than it etches vertically exposed surfaces. The polymer promoting etch will also deposit polymers on the vertically exposed surfaces, and as a result will not substantially etch the vertically exposed surfaces. In a second stage, and preferably prior to etching into gate oxide layer 18, the etch process is switched to a non-polymer promoting etch, preferably using a non-carbon etchant. The etch is then less anisotropic and more isotropic, creating a large base by etching into both spacer 28 and gate oxide layer 18. A broader based recess 30 results as shown in FIG. 3B. Both etches of the two (2) stages are preferably selective to gate layer 22.

Figure 3C:
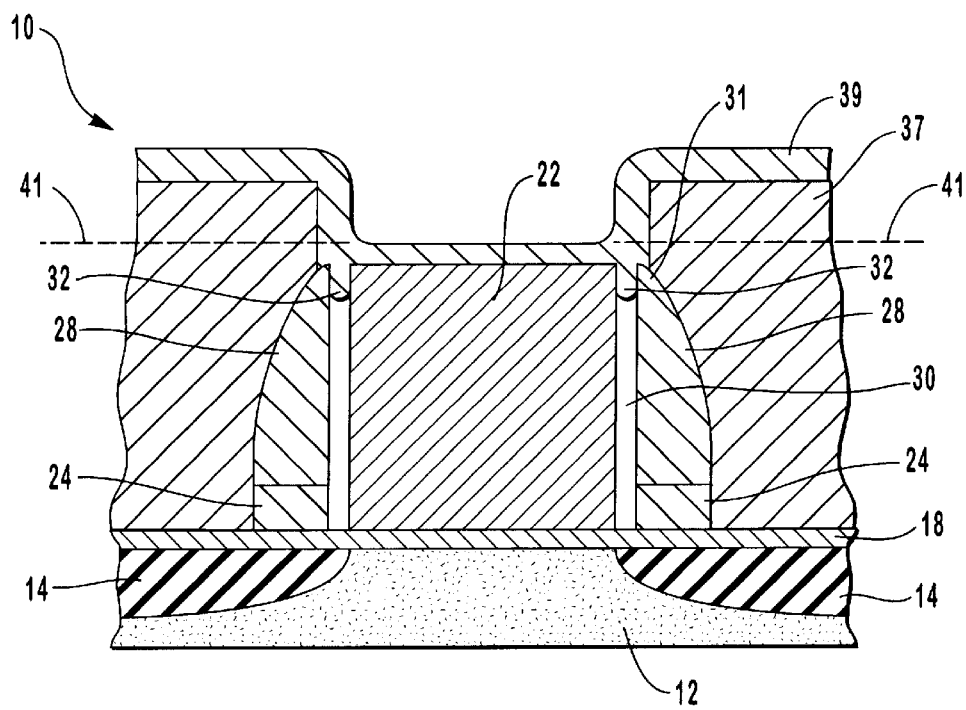
FIG. 3C is a partial cross-sectional elevation view of the structure of FIG. 2 after a mask layer is used to etch a recess between the gate stack and the spacer, followed by the formation of a cover layer over an opening to the recess.

A third way to form recess 30 is illustrated in FIG. 3C. A layer of photoresist 37 is formed over spacers 28. Layer of photoresist 37 is patterned to expose gate layer 22 and layer of primary material above where recess 30 is desired. An etch, preferably anisotropic, is then performed. The etch is selective to gate layer 22 and gate oxide layer 18, but is not selective to layer of primary material 24. It is preferred that a dry etch be used to create recess 30. After the etching process, the layer of photoresist is then removed.

Figure 3D:
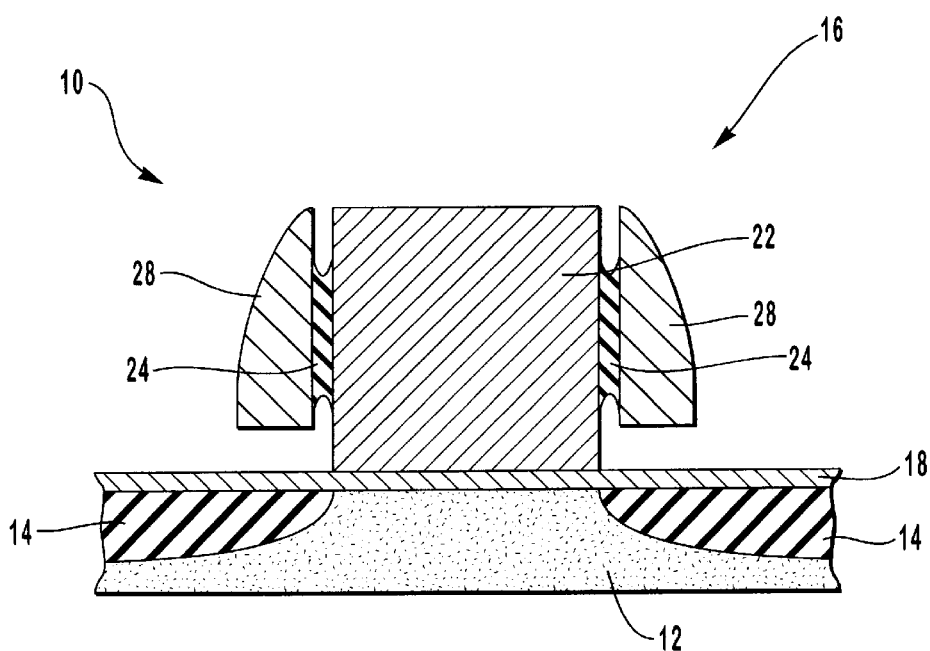
FIG. 3D is a partial cross-sectional elevation view of the structure of FIG. 2 after an etch creating a recess between the gate stack and the spacer, and between the spacer the silicon base layer.

A fourth way to form recesses between gate layer 22 and spacers 28 is illustrated in FIG. 3D. An etch removes a substantially all of layer of primary material 24 except for a portion thereof that secures spacers 28 to gate layer 22. The etch is preferably isotropic and is selective to the material of spacers 28 and to gate oxide layer 18, but unselective to layer of primary material 24.

In any of the foregoing four methods for forming recess 30, a portion of layer of primary material 24 remains after the etch, either under spacer 28, between spacer 28 and gate layer 22 upon gate oxide 18, or both.

After recess 30 is formed, as shown in FIGS. 3A–3D, recess 30 is closed off with a cap 32 without filling recess 30.

Once cap 32 closed recess 30, recess 30 is filled with ambient gas, such as air. As such, there is a low dielectric characteristic in the area between gate layer 22, spacer 28, and source/drain regions 14 due to the closed off recess 30 which is essentially an gas filled void defined by the materials that enclose it.

Figure 4:
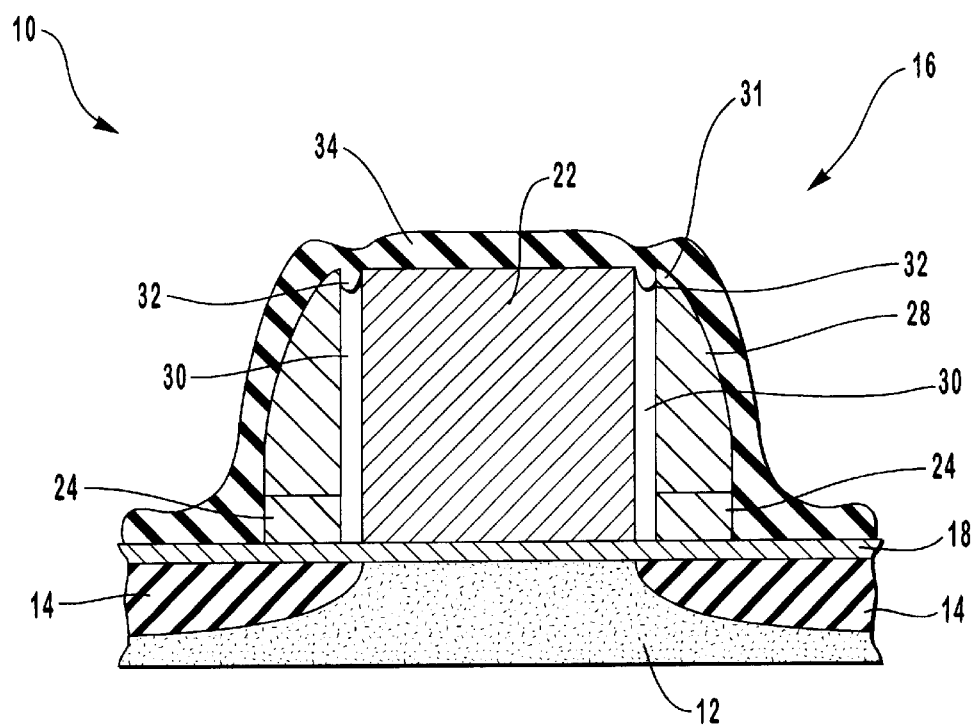
FIG. 4 is a partial cross-sectional elevation view of the structures of FIG. 3A showing the recess closed by forming a cover layer over an opening thereto.

Cap 32 can be formed in a variety of ways, as illustrated in FIGS. 3B, 3C, and 4. In FIG. 3B, following the formation of recess 30, gate oxide layer 18 is re-oxidized by silicon dioxide growth from silicon base layer 12 and gate layer 22, which is preferably substantially composed of polysilicon. The exposed surfaces of gate layer 22 are oxidized in the ambient air to as to close the opening to recess 30 by formation of a cap 32.

Because a small amount of gate oxide layer 18 is removed during the etch, silicon base layer 12 should be re-oxidized where gate oxide layer 18 is removed, such as by using a conventional heat treating process, to replace the removed oxide of gate oxide 18. The reoxidation process is advantageously used to grow caps 32 over the opening to recess 30 as illustrated in FIG. 3B. Lateral growth of oxide in cap 32 of at least about 150 Å is sufficient to close recess 30 effectively.

Instead of the foregoing oxidation process to close the opening to recess 30 and form cap 32, a material such as polysilicon could be deposited to form cap 32 by decomposition of a tetraethylorthosilicate (TEOS) precursor. When spacers 28 are substantially composed of an electrically conductive material such as polysilicon, however, gate layer 22 is to be electrically insulated from spacers 28 by used of a cap 32 that is substantially composed of a dielectric material.

FIG. 3C shows another technique for forming cap 32 to close off recess 30. The photolithographic process described above is used to form layer of photoresist 37, after which a layer of material 39 is deposited thereover so as to partially fill recess 30 and form caps 32. Layer of material 39 is deposited on the top of spacers 28, over a top surface of gate layer 22, and over recess 30 so as to close it off by a non-conformal deposition process. Due to the presence of layer of photoresist 37, layer of material 39 is not formed upon spacers 28. Layer of photoresist 37 and layer of material 39 are then conventionally removed so as to leave that portion of layer of material 39 below a phantom line 41. When spacer 28 is electrically insulative, layer of material 39 can be electrically conductive because gate layer 22 will still be electrically isolated by spacers 28 and recess 30 from source/drain regions 14. Preferably, layer of material 39 does not extend down the side of spacer 28 because gate layer 22 is required to be electrically isolated from source/drain regions 14.

It is intended that any combination of oxide growth and deposition process can be combined to close the opening to recess 30 to form a void. As the size of recess 30 is increased, the capacitance is reduced. The size of recess 30 is limited by process parameters as well as structural limitations including the structural requirements of spacer 28.

Figure 3E:
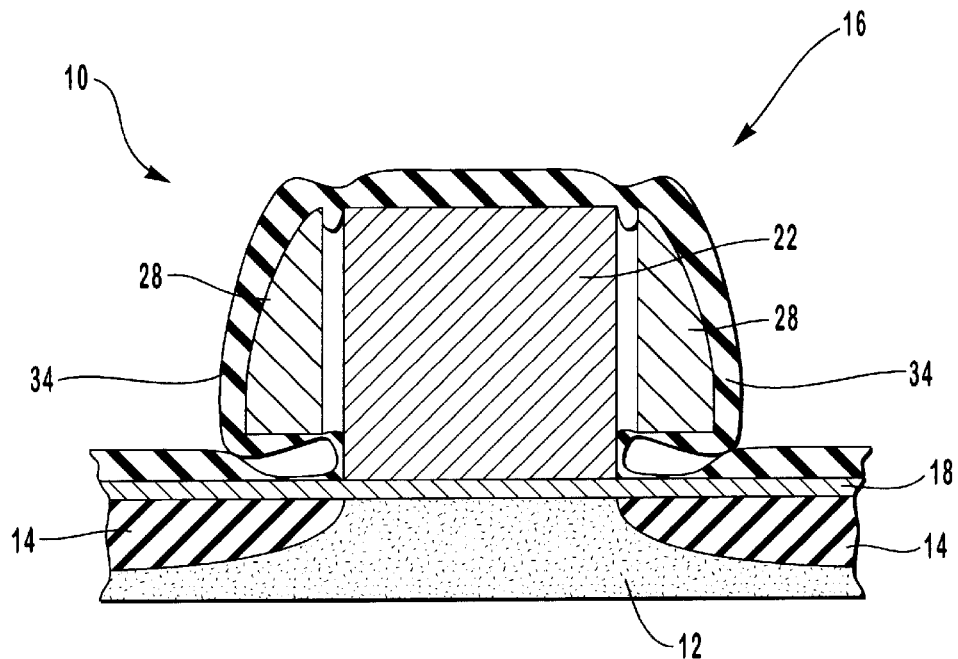
FIG. 3E is a partial cross-sectional elevation view of the structure of FIG. 3D wherein the recesses created by the etch are closed by forming a cover layer using a deposition process.

In FIGS. 3E and 4, a cover layer 34 is deposited non-conformally over gate layer 22 and spacers 28. It is preferred that cover layer 34 be a non-conformal layer that forms cover 32 which closes off the opening to recess 30 but does not substantially fill recess 30. As seen in FIG. 3E, four (4) recesses are formed, and in FIG. 4 two (2) recesses have been formed. To obtain a preferred thickness of cover layer 34, recess 30 should have an aspect ratio of at least 6 to 1. As cover layer 34 is deposited non-conformally, a bread-loafing effect takes place at the opening to recess 30 so as to pinch off the opening to recess 30. The bread-loafing effect prevents further filling of recess 30 as a result of the pinched off opening to recess 30.

Cover layer 34 will preferably be substantially composed of an electrically insulative material so that gate layer 22 will be electrically insulated from spacers 28 when they are substantially composed of an electrically conductive material such as polysilicon. Preferably, however, cover layer 34 will be substantially composed of a material selected from the group consisting of silicon nitride, silicon dioxide, or any dielectric material having a low dielectric constant.

Figure 5:
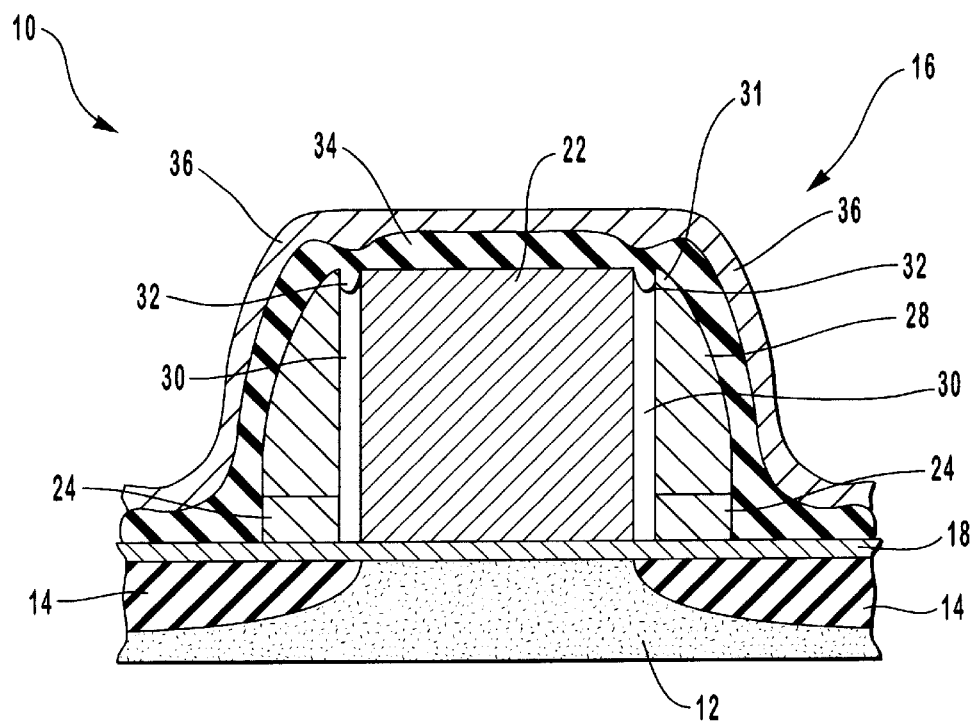
FIG. 5 is a partial cross-sectional elevation view of the structure of FIG. 4 with a passivation layer formed there over.

As shown in FIG. 5, a passivation layer 36 is formed over cover layer 34, gate layer 22, spacers 28, and silicon base layer 12. Passivation layer 36 is substantially composed of a dielectric material. Preferably, passivation layer 36 is deposited by decomposing a TEOS precursor to form a layer of silicon dioxide.

The present invention also related to inventive structures and processes for forming the same, which structures reduce the parasitic capacitance of the active elements of a semiconductor including transistors, capacitors, resistors, and diodes. The effect of parasitic capacitance is reduced using the dielectric characteristics of a void within a trench isolation feature situated in between active elements. In general, the invention contemplates an etch process that will not be selective to a material into which a trench will be etched, and that will be selective to a material projecting adjacent to and projecting above the trench. This aspect of the invention is described below relative to diode isolation that utilizes a recess or trench. This description, however, should not be viewed as limiting the application to diode isolation.

Figure 6:
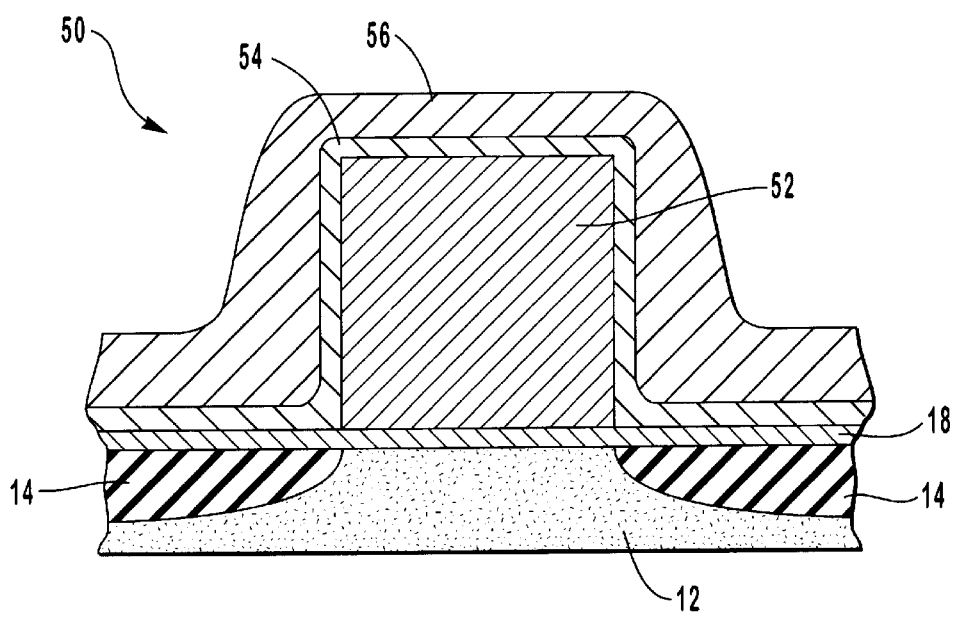
FIG. 6 is a partial cross-sectional elevation view of a semiconductor substrate with an oxide layer and a layer of spacer material formed thereover, with a substantially vertical structure formed thereon.

A process for diode isolation is illustrated in FIGS. 6–11. Seen in FIG. 6 is a structure 50 formed on a silicon base layer 12. Overlaying silicon base layer 12 is an oxide layer 18. Oxide layer 18 may be relatively thin in comparison with the other layers depicted in FIGS. 6–11.

An insulation layer 52 overlays oxide layer 18. Insulation layer 52 has been conventionally formed into a substantially vertical structure projecting from silicon base layer 12. Preferably, insulation layer 52 is substantially composed of a dielectric material, and is more preferably substantially composed of silicon nitride.

A layer of primary material 54 is deposited over the substantially vertical structure formed by insulation layer 52 and silicon base layer 12. A layer of secondary material 56 is formed over layer of primary material 54. Layer of secondary material 56 is substantially composed of a material other then that of which layer or primary material 54 is substantially composed. Preferably, layer of secondary material 54 is substantially composed of a material selected from the group consisting of silicon dioxide, polysilicon, or silicon nitride.

Figure 7:
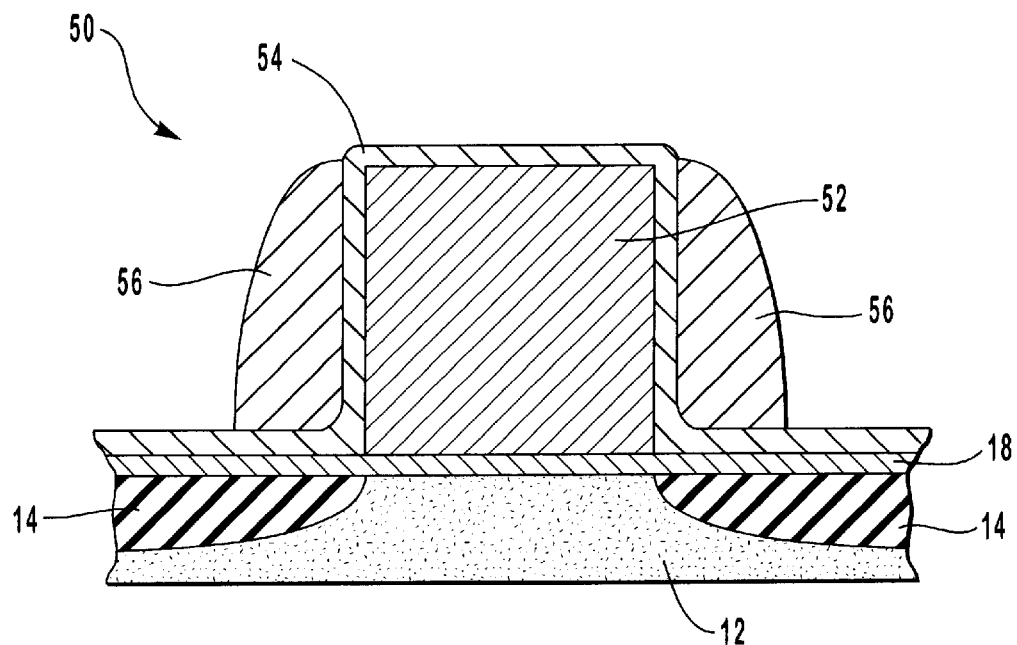
FIG. 7 is a partial cross-sectional elevation view of the structure of FIG. 6 with an electrically insulated spacer formed from the layer of spacer material adjacent to each side of the substantially vertical structure.

As shown in FIG. 7, layer of secondary material 56 is subjected to a spacer etch that is selective to layer of primary material 54. Spacers 56 seen in FIG. 7 are formed by the spacer etch. Layer of secondary material 56 and layer of primary material 54 must be made of different materials so that the selectivity of the spacer etch will create spacers 56 with layer of primary material 56 remaining on top of insulation layer 52.

Figure 8:
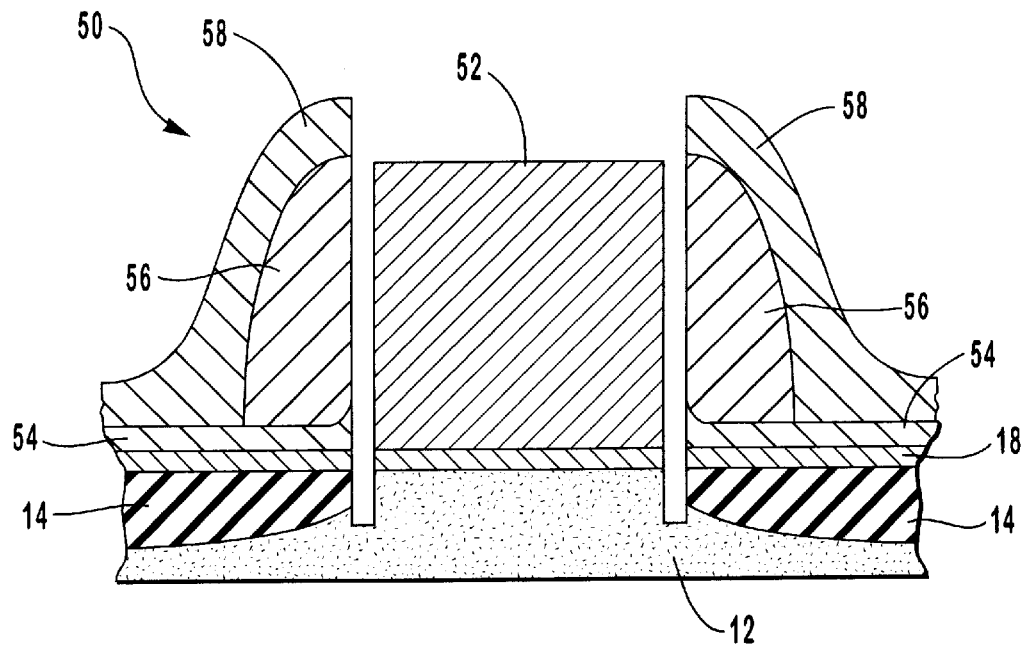
FIG. 8 is a partial cross sectional elevation view of the structure of FIG. 7 where a layer of photoresist has been formed over the spacers, and a recess has been etched between each side of the substantially vertical structure and its adjacent spacer and into the semiconductor substrate.

As seen in FIG. 8, a photoresist layer 58 is formed over layer of primary material 54, spacers 56, and oxide layer 18. Photoresist layer 58 is patterned to expose the area in between spacers 56. A first etch that is selective to insulation layer 52 and is not selective to layer of primary material 54 or to oxide layer 18 is performed to form a recess 60. After the first etch, recess 60 extends between spacer 56 and insulation layer 52 to terminate at silicon base layer 12. Photoresist layer 58 can be used to protect insulation layer 52 from the first etch.

A second etch is now performed that is selective to oxide layer 18, insulation layer 52, and is not selective to silicon base layer 12. The second etch extends recess 60 into silicon base layer 12 as shown in FIG. 8.

Figure 9:
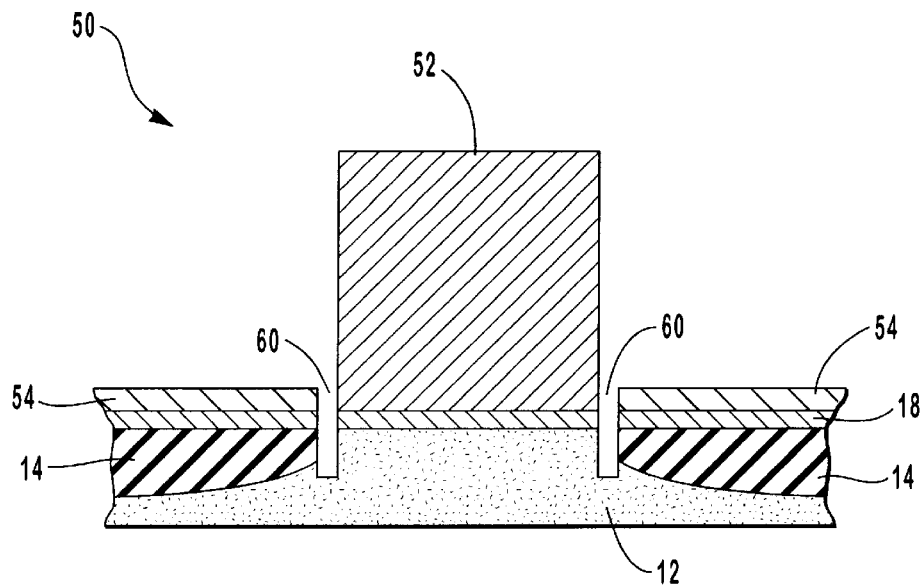
FIG. 9 is a partial cross-sectional elevation view of the structure of FIG. 8 after removal of the photoresist and an etching.

As shown in FIG. 9, photoresist layer 58 and spacers 56 are removed leaving insulation layer 54 and layer of primary material 56 upon oxide layer 18. Photoresist layer 58 can be removed using conventional methods after either the first etch or the second etch depending on the composition of spacers 56. If spacers 56 are substantially composed silicon dioxide, and if the second etch is selective to silicon dioxide, then photoresist layer 58 can be removed prior to second etch. If spacers 56 are not substantially composed of silicon dioxide, and the second etch is not selective to silicon dioxide, photoresist layer 58 can be removed after the second etch.

Spacers 56 can be removed by the second etch or a third etch depending on the material of which spacers 56 are composed. For example, if spacers 56 are substantially composed of silicon nitride, spacers 56 can be removed at the same time that insulation layer 52 is removed if it is also composed of silicon nitride. In contrast, if spacers 56 are substantially composed of polysilicon, spacers 56 should be removed by the second etch which may be made non-selective to polysilicon.

Figure 10:
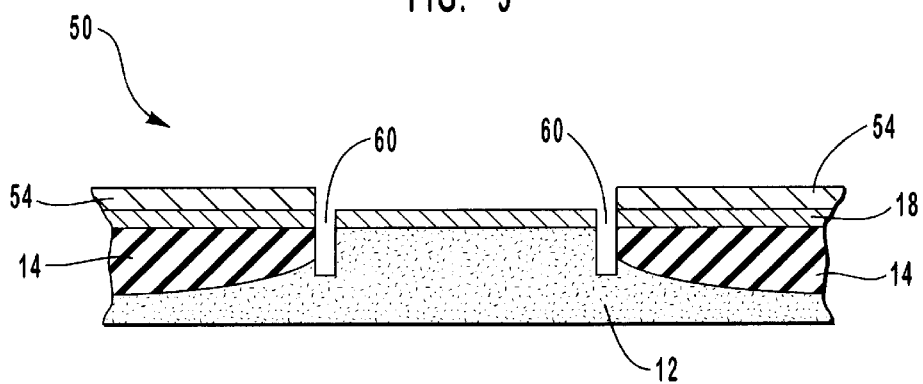
FIG. 10 is a partial cross-sectional elevation view of the structure of FIG. 9 upon removal of the substantially vertical structure.

As seen in FIG. 10, insulation layer 52 is removed. Insulation layer 52 can be removed by a third etch that is selective to both silicon dioxide and silicon. As such, the third etch removes insulation layer 52, but leaves gate oxide layer 18 which is preferably substantially composed of silicon dioxide, and also leaves silicon base layer 12 which is preferably made of silicon.

Figure 11:
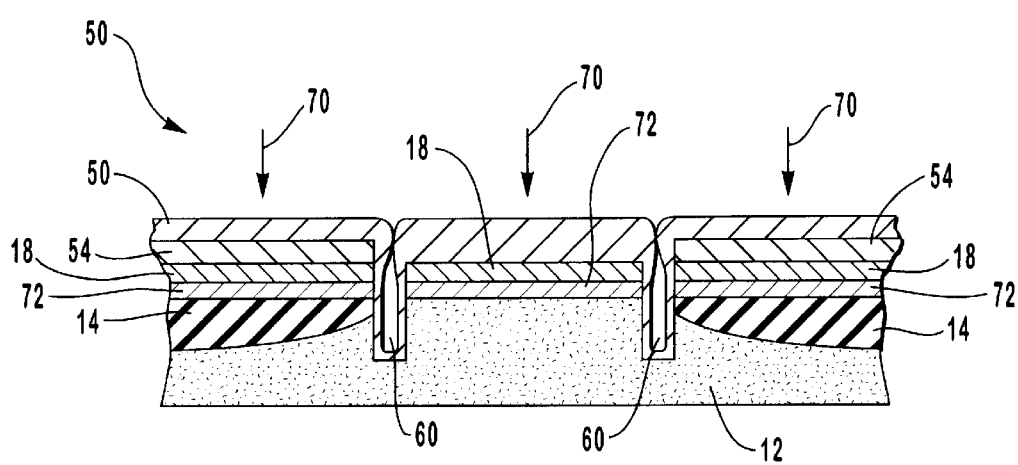
FIG. 11 is a partial cross-sectional elevation view of the structure of FIG. 10 with the recess covered by a cap layer formed thereover.

As seen in FIG. 11, the opening to recess 60 is closed by a non-conformal deposition of a cap layer 62. The non-conformal deposition of cap layer 62 deposits a small amount of material into recess 60. More importantly, the deposition of cap layer 62 closes off the opening to recess 60 due to a bread loafing effect that pinches off the opening to recess 60, thus preventing further deposition therein. Preferably, recess 60 will be substantially closed off so as to entrap a portion of ambient gas, such as air, within recess 60.

Regions 72 seen in FIG. 11 are doped portions of silicon base layer 12, which doping is opposite in conductivity type from the doping of that portion of silicon base layer 12 extending below regions 72. By way of example, regions 72 can have an N+ doping while being situated within a P-doped well of silicon base layer 12. Various methods can be used to dope regions 72, including conventional blanket ion implantation or masked ion implantation. FIG. 11 shows ion implantation by arrows 70. Doped regions 72 are separated by recesses 60 and function as isolated diodes. The process for forming recess 60, which is a type of shallow trench isolation, can be used in other process flows to isolate other active elements including transistors, capacitors, and resistors.

Figure 12:
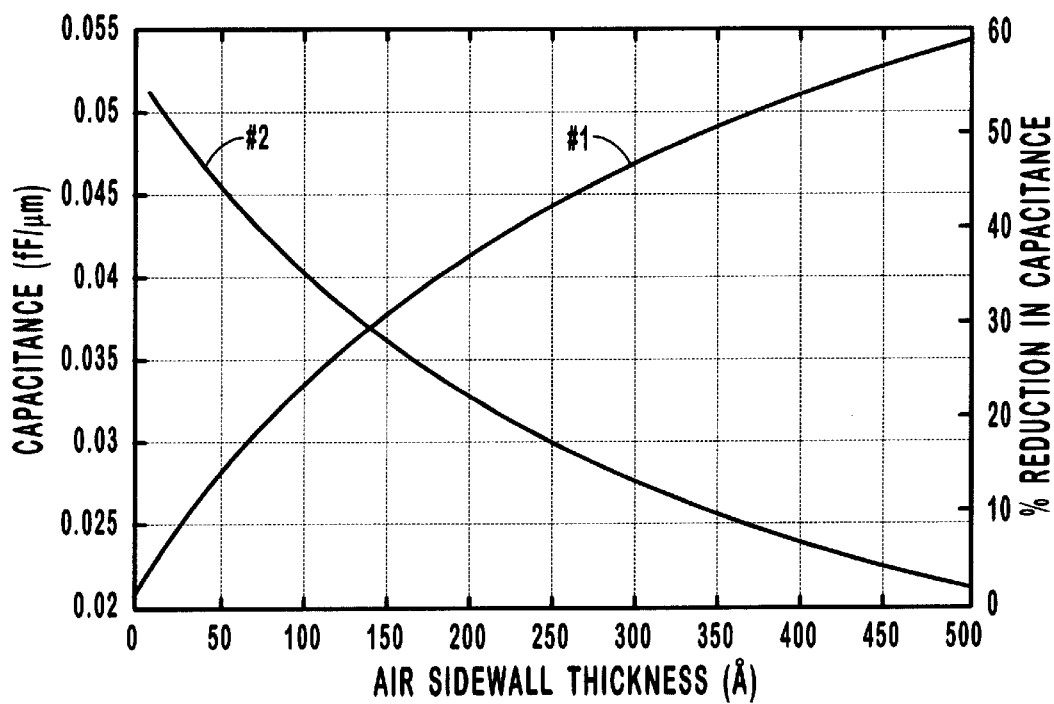
FIG. 12 is an exemplary graph predicting reductions in MOS transistor fringe capacitance.

FIG. 12 illustrates capacitance as a function of the thickness of a recess within a spacer having a thickness of 1000 Angstroms. The graph predicts capacitance for a recess thickness from zero to 500 Angstroms. A curve #1 is shown for total sidewall capacitance and another curve #2 is shown for the percentage reduction in capacitance. By way of example, at 20 fF/$\mu$m capacitance and for 100 Angstroms in recess thickness within a spacer having a thickness of 1000 Angstroms, curve #1 predicts about a twenty percent (20%) reduction in capacitance. FIG. 12 indicates that as a recess in a spacer is enlarged, capacitance is lowered. It is intended that FIG. 12 be provided only as exemplary of the results obtained and extrapolated into graph form.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A void formation method comprising:

providing a structure projecting from a semiconductor substrate, said structure having opposing first and second lateral sides;

forming a layer of primary material over said structure remote from said semiconductor substrate;

forming a layer of secondary material extending continuously upon and over said layer of primary material;

selectively removing some of the primary and secondary materials;

forming a cover layer continuously upon the semiconductor substrate, the structure, and the primary and secondary materials to form, adjacent to each of the first and second lateral sides of the structure, a plurality of closed voids.

2. The method as defined in claim 1, wherein selectively removing some of the primary and secondary materials comprises removing a portion of said layer of secondary material that extends above the structure.

3. The method as defined in claim 2, wherein:

removing said portion of said layer of secondary material that extends above the structure comprises a spacer etch of said layer of secondary material to form, adjacent to each of the first and second lateral sides of the structure, a spacer upon the layer of primary material and;

each said closed void is situated between one of said spacers and the structure.

4. The method as defined in claim 1, wherein:

selectively removing some of the primary and secondary materials comprises forming a recess having an opening remote from said semiconductor substrate and defined in part by one of the first and second lateral sides of the structure and said layer of secondary material; and forming said cover layer comprises depositing the cover layer over said opening of said recess without filling said recess with said cover layer.

5. The method as defined in claim 1, wherein:

selectively removing some of the primary and secondary materials comprises removing a portion of said layer of primary material to form a recess having an opening remote from said semiconductor substrate and defined in part by one of the first and second lateral sides of the structure and said layer of secondary material.

6. The method as defined in claim 5, wherein removing said portion of said layer of primary material comprises etching said portion of said layer of primary material with an etch that is selective to said structure and to said layer of secondary material.

7. The method as defined in claim 1, wherein:
selectively removing some of the primary and secondary materials comprises:
forming a patterned layer of photoresist upon said layer of secondary material to expose said structure and a portion of said layer of primary material extending above the structure;
forming a recess having an opening remote from said semiconductor substrate and defined in part by one of the first and second lateral sides of the structure and said layer of secondary material;
forming said cover layer comprises depositing said cover layer over said opening of said recess without filling said recess with said cover layer.

8. The method as recited in claim 1, wherein said layer of secondary material comprises material selected from the group consisting of silicon dioxide, polysilicon, and silicon nitride.

9. The method as recited in claim 1, wherein said structure comprises a gate layer projecting from a gate oxide layer, said gate layer being adjacent to an electrically active area within said semiconductor substrate.

10. The method as recited in claim 1, wherein:
said layer of primary material is substantially composed of one of silicon dioxide and silicon nitride; and
the layer of secondary material is composed of the other of silicon dioxide and silicon nitride.

11. The method as recited in claim 4, wherein said layer of primary material has a thickness in the range of about 100 Å to about 150 Å.

12. The method as recited in claim 7, wherein:
said cover layer is composed of a dielectric material; and
said layer of secondary material is composed of an electrically conductive material.

13. The method as recited in claim 6, wherein said etch is a dry etch.

14. The method as recited in claim 6, wherein said etch is a wet etch.

15. The method as recited in claim 1, wherein said ambient gas is air.

16. The method as recited in claim 7, wherein said cover layer over said opening of said recess is composed of a material selected from the group consisting of silicon nitride, silicon dioxide, and polysilicon.

17. The method as recited in claim 7, wherein said cover layer is composed of an electrically conductive material and said layer of secondary material is substantially composed of a dielectric material.

18. The method as recited in claim 1, wherein:
selectively removing some of the primary and secondary materials comprises:
performing a spacer etch of said layer of secondary material to form a pair of spacers upon the layer of primary material, each said spacer being adjacent one of said first and second lateral sides of the structure; and
etching a portion of said layer of primary material with an etch that is selective to said structure and to said layer of secondary material to form an opening to a recess that is remote from said semiconductor substrate with an etchant that is selective to said structure and to said spacer;
forming said cover layer comprises depositing said cover layer over an opening to the recess remote from said semiconductor substrate.

19. The method as recited in claim 1, wherein:
selectively removing some of the primary and secondary materials comprises:
performing a spacer etch of said layer of secondary material to form a pair of spacers upon the layer of primary material, each said spacer being adjacent one of the first and second lateral sides of the structure;
etching a portion of said layer of primary material with an etch that is selective to said structure and said layer of secondary material to form adjacent each of the first and second lateral sides of the structure:
a top portion of the layer of primary material that is remote from the semiconductor substrate;
a bottom portion of the layer of primary material that is proximal to the semiconductor substrate;
a first recess defined in part by the structure and the top portion of the layer of primary material, the first recess having an opening remote from the semiconductor substrate; and
a second recess defined in part by the structure and the bottom portion of the layer of primary material, the second recess having an opening proximal to the semiconductor substrate;
forming said cover layer comprises depositing said cover layer over the opening to the first recess and the opening to the second recess on each of the first and second lateral sides of the structure.

20. The void formation method as recited in claim 3, wherein:
said plurality of closed voids comprises four closed voids;
two of the four closed voids are defined by the cover layer, one of the opposing lateral sides of the structure, and one of the spacers; and
the other two of the four closed voids are defined by the semiconductor substrate, the cover layer, one of the opposing lateral sides of the structure, and one of the spacers.

21. The void formation method sad recited in claim 1, wherein:
said plurality of closed voids comprises four closed voids;
two of the four closed voids are not defined in part by the semiconductor substrate; and
the other two of the four closed voids are defined in part by the semiconductor substrate.

22. The void formation method as recited in claim 3, wherein:
said plurality of closed voids comprises two pairs of said closed voids;
one said pair of said closed voids is adjacent to the first lateral side of the structure; and
the other of said pair of said closed voids is adjacent to the second lateral side of the structure.

23. The void formation method as recited in claim 22, wherein one said spacer separates each said closed void from the other said closed void in each said pair of said closed voids.

24. A method for insulating a gate comprising:
providing a gate stack projecting from a gate oxide layer upon a semiconductor substrate, said gate stack having first and second opposing lateral sides and a top surface;
forming a layer of primary material over said top surface of said gate stack and over said first and second opposing lateral sides of said gate stack;

forming a layer of secondary material over said layer of primary material and said layer of secondary material;

performing a spacer etch of said layer of secondary material to form a first spacer and a second spacer respectively upon each portion of the layer of primary material that is on the first and second lateral sides of the gate stack;

etching said layer of primary material with an etch that is selective to said gate stack and to said layer of secondary material to form adjacent each of the first and second opposing lateral sides of the gate stack:

a first portion of the layer of primary material that is remote from the semiconductor substrate and that secures the first spacer to the gate stack;

a second portion of the layer of primary material that is remote from the semiconductor substrate and that secures the second spacer to the gate stack;

forming a cover layer extending continuously upon and over the gate stack, the first spacer, the second spacer, and the gate oxide layer to form, adjacent to each of the first and second lateral sides of the gate stack, a plurality of closed voids each filled with an ambient gas and situated between the layer of primary material, the layer of secondary material, and the gate stack.

25. A method for forming an insulated structure comprising:

providing a structure projecting from a semiconductor substrate, said structure having opposing first and second lateral sides;

forming a layer of primary material over said structure, said layer of primary material having a top surface that is remote from said semiconductor substrate;

forming a layer of secondary material over said layer of primary material;

removing a portion of said layer of secondary material to expose said top surface of said layer of primary material;

removing a portion of said layer of primary material to form, adjacent to each of the first and second lateral sides of the structure, a recess between the layer of secondary material and one of the opposing first and second lateral sides of said structure, each said recess having an opening remote from said semiconductor substrate;

forming a closing layer extending continuously upon and over said opening of each said recess to form, adjacent to each of the first and second lateral sides of the structure, a plurality of closed empty spaces situated between the closing layer and the semiconductor substrate.

26. A method for forming a closed void comprising:

providing a structure projecting from a semiconductor substrate, said structure having opposing first and second lateral sides;

forming a layer of primary material over said structure having a top surface remote from said semiconductor substrate;

forming a layer of secondary material over said layer of primary material;

performing a spacer etch of said layer of secondary material to form therefrom a spacer upon the layer of primary material;

etching said portion of said layer of primary material with an etch that is selective to said structure and said layer of secondary material to form a recess adjacent to each of the first and second lateral sides of the structure, each said recess being situated between the spacer and the structure and having an opening remote from said semiconductor substrate;

forming a cover layer extending continuously upon and over said opening of each said recess without filling each said recess with said cover layer so as to form, adjacent to each of the first and second lateral sides of the structure, a plurality of closed voids filled with an ambient gas.

27. A method for making an insulated structure comprising:

forming a gate layer upon a gate oxide layer situated upon a silicon base layer, said gate layer being adjacent to an electrically active region within said silicon base layer, said gate layer having opposing first and second lateral sides;

forming a layer of primary material over said gate layer;

forming a layer of secondary material over said layer of primary material;

selectively removing a portion of said layer of secondary material to create, adjacent to each of the first and second lateral sides of the each layer, a spacer that is attached to the gate layer by the layer of primary material;

etching a portion of said layer of primary material situated between each of the spacers and the gate layer to form thereat a recess having an opening thereto remote from said silicon base layer;

forming cover layer extending continuously upon and over the opening to each of the recesses, wherein a plurality of closed empty spaces is situated adjacent to each of the first and second lateral sides of the gate layer between the cover layer and the silicon base layer.

28. The method as recited in claim 27, wherein:

said layer of primary material is composed of one of silicon dioxide and silicon nitride; and the layer of secondary material is composed of the other of silicon dioxide and silicon nitride.

29. The method as recited in claim 28, wherein said layer of primary material is composed of silicon nitride and has a thickness in the range of about 100 Å to about 150 Å.

30. A method for making an insulated structure comprising:

forming a gate layer upon a gate oxide layer situated upon a silicon base layer, said gate layer being adjacent to an electrically active region within said silicon base layer, said gate layer having opposing first and second lateral sides;

forming a layer of primary material over said gate layer;

forming a layer of secondary material over said layer of primary material;

selectively removing a portion of said layer of secondary material to create, adjacent to each of the first and second lateral sides of the gate layer, a spacer that is attached to the gate layer through the layer of primary material;

forming a patterned layer of photoresist upon each said spacer to expose the layer of primary material extending above the structure;

etching a portion of said layer of primary material situated between each said spacer and the gate layer to form a recess having an opening thereto remote from said silicon base layer;

forming cover layer extending continuously upon and over the opening to each said recess, wherein, adjacent to each of the first and second lateral sides of the gate layer, a plurality of closed empty spaces is situated between the cover layer and the silicon base layer.

31. A method for making an insulated structure comprising:

providing a polysilicon gate stack projecting above a silicon base layer, said polysilicon gate stack being located adjacent to an electrically active region within said silicon base layer, said polysilicon gate layer having opposing first and second lateral sides;

forming a layer of silicon nitride over said gate stack, said layer of silicon nitride having a thickness of about 100 Å to about 150 Å;

forming a layer of a secondary material over said layer of silicon nitride;

spacer etching said layer of secondary material using a process that is selective to silicon nitride, said spacer etch forming, adjacent to each of the opposing first and second lateral sides of the polysilicon gate stack, a spacer upon the layer of silicon nitride;

selectively etching a portion of said layer of silicon nitride utilizing an anisotropic dry etch process that is selective to said layer of secondary material to form a recess defined in part between each of the opposing first and second lateral sides of said polysilicon gate stack and each said spacer, each said recess having an opening remote from said semiconductor substrate;

forming a silicon dioxide layer extending continuously upon and over said polysilicon gate stack and said opening of each said recess to cover said opening of each said recess and form, adjacent to each of the first and second lateral sides of the polysilicon gate stack, a plurality of closed voids filled with an ambient gas.

32. A method for making an insulated structure as recited in claim 31, wherein said layer of secondary material comprises a material selected from the group consisting of silicon dioxide and polysilicon.

33. A method for isolating an electrically active area comprising:

providing a structure projecting from a substrate;

forming a layer of primary material over said structure;

forming a layer of secondary material over said layer of primary material;

removing a portion of said layer of secondary material that extends above the structure;

forming a recess having an opening remote from said substrate by:
  forming a mask patterned to expose the structure and the layer of primary material adjacent thereto; and
  exposing a surface on said substrate adjacent to said structure by removing the layer of primary material adjacent to the structure with a first etch process that is selective to said layer of secondary material and to the structure, wherein the recess is defined by:
    a sidewall of said structure;
    said layer of secondary material; and
    said substrate;

removing the mask and the structure;

forming a closing layer extending continuously upon and over said opening of said recess without substantially filling said recess, whereby the opening to the recess is closed and a closed void is thereby formed within said recess.

34. The method as defined in claim 33, wherein:
there are opposing sidewalls of the structure; and
there are a plurality of said recesses that are formed on each of the opposing sidewalls of said structure.

35. The method as defined in claim 33, wherein forming said recess further comprises etching into said substrate with a second etch process that is selective to said layer of secondary material and to said structure, and that is not selective to said substrate.

36. The method as defined in claim 34, wherein there are two of said recesses that are formed on each of the opposing sidewalls of said structure.

37. The method as defined in claim 34, wherein removing said portion of said layer of secondary material that extends above the structure is a spacer etch that forms a spacer, on each of the opposing sidewalls of said structure, upon the layer of primary material, and wherein the recess is situated between the spacer and the structure.

38. The method as defined in claim 33, wherein forming said closing layer over said opening of said recess comprises a deposition process for depositing said closing layer to close off the opening of the recess such that the closing layer does not fill the recess and does close the opening to the recess.

39. A method of forming a semiconductor device, the method comprising:

forming a substrate having an electrically conductive raised feature projecting therefrom, the electrically conductive raised feature having opposing first and second lateral sides;

forming, adjacent to each of the opposing first and second lateral sides of the electrically conductive raised feature, a spacer projecting from the semiconductor substrate; and forming a cover layer continuously upon each said spacer and the electrically conductive raised feature, wherein the cover layer with each said spacer and the semiconductor substrate define, adjacent to each of the first and second lateral sides of the structure, a plurality of closed voids.

40. A method of forming a semiconductor device, the method comprising:

providing a semiconductor substrate having an active area therein and having a silicon dioxide layer thereon;

forming a gate stack projecting from the silicon dioxide layer adjacent to said active area and having a sidewall, the gate stack having opposing first and second lateral sides;

forming an insulative spacer on each of the opposing first and second lateral sides of said gate stack;

forming a cover disposed continuously upon the gate stack and each said insulative spacer, wherein the opposing first and second lateral sides of the gate stack, the cover, and each said spacer form, adjacent to each of the first and second lateral sides of the structure, a plurality of closed voids.

41. The method as recited in claim 40, wherein each said spacer is composed of material selected from the group consisting of oxide, polysilicon, and silicon nitride.

42. The method as recited in claim 40, wherein each said spacer is composed of polysilicon.

43. The method as recited in claim 40, wherein said gate stack is composed of polysilicon.

44. The method as recited in claim 40, wherein said cover is composed of a material selected from the group consisting of polysilicon, and a dielectric material.

45. A method of forming a semiconductor device, the method comprising:
  forming a gate stack projecting from a gate oxide layer upon a semiconductor substrate, said gate stack having first and second opposing lateral sides and a top surface;
  forming a first spacer and a second spacer respectively projecting from said first and second opposing lateral sides of said gate stack and respectively being attached thereto by first and second portions of a layer of primary material;
  forming a cover layer extending continuously upon the gate stack, the first spacer, the second spacer, and the gate oxide layer, the cover layer with the first and second spacers and the gate oxide defining, adjacent to each of the first and second opposing lateral sides of the gate stack, a plurality of closed voids each being filled with an ambient gas.

46. A method of forming a gate structure, the method comprising:
  forming a gate stack projecting from a gate oxide layer upon a semiconductor substrate, said gate stack having first and second opposing lateral sides;
  forming a first spacer and a second spacer respectively attached to said first and second opposing lateral sides of said gate stack, respectively, by first and second portions of a layer of primary material; and
  forming a cover layer extending continuously upon the gate stack, the first spacer, the second spacer, and the gate oxide layer so as to define:
    a first closed and ambient gas filled void located between the gate oxide and the first spacer;
    a second closed and ambient gas filled void located between the gate oxide and the second spacer;
    a third closed and ambient gas filled void located between the gate stack and the first spacer; and
    a fourth closed void situated between the gate stack and the second spacer.

47. The method as defined in claim 46, wherein:
  the third void has an interface with both the gate stack and the first spacer; and
  the fourth void has an interlace with both the gate stack and the second spacer.

48. The method as defined in claim 46, wherein:
  the first and second spacers are composed of a material that is different than the material of which the layer of primary is composed.

49. A method of forming a gate structure, the method comprising:
  forming a gate stack projecting from a gate oxide layer upon a semiconductor substrate, said gate stack having first and second opposing lateral sides and a top surface therebetween;
  forming a first spacer and a second spacer that are:
    separated from and adjacent to, respectively, said first and second opposing lateral sides of said gate stack; and
    situated upon, respectively, first and second portions of a layer of primary material that is upon the gate oxide;
  forming a cover layer extending continuously upon:
    the first spacer;
    the top surface of the gate stack; and
    the second spacer;
  wherein, adjacent to each of the first and second opposing lateral sides of the gate stack, a plurality of closed voids each filled with ambient gas is situated between the gate oxide and the cover layer.

50. The method as defined in claim 49, wherein the cover layer extends continuously between:
  the first portion of the layer of primary material and the first spacer; and
  the second spacer and the second portion of the layer of primary material.

51. The method as defined in claim 49, wherein:
  the first and second spacers are composed of a material that is different than the material of which the layer of primary material is composed.

52. A void formation method comprising:
  providing a structure projecting from a semiconductor substrate, said structure having first and second opposing lateral sidewalls;
  forming a layer of primary material over said structured, said layer of primary material having a top surface remote from said semiconductor substrate;
  forming a layer of secondary material composed of an electrically conductive material over said layer of primary material;
  forming, adjacent to each of the first and second opposing lateral sides of the structure, a plurality of closed voids each situated between the layer of secondary material and one of the first and second opposing lateral sides of said structure by:
    forming a patterned layer of photoresist upon said layer of secondary material to expose said structure and a portion of said layer of primary material extending above the structure;
    forming, adjacent to each of the first and second opposing lateral sides of the structure, a recess having an opening remote from said semiconductor substrate and defined in part by the one of the first and second opposing lateral sides of said structure and said layer of secondary material; and
    forming a cover layer composed of a dielectric material over said opening of said recess without filling any of said recesses with said cover layer.

53. A void formation method comprising:
  providing a structure projecting from a semiconductor substrate, said structure having first and second opposing lateral sides;
  forming a layer of primary material over said structure having a top surface remote from said semiconductor substrate;
  forming a layer of secondary material over said layer of primary material;
  forming, adjacent to each of the first and second opposing lateral sides of the structure, a plurality of closed voids each situated between the layer of secondary material and one of the first and second opposing lateral sides of said structure by:
    forming a patterned layer of photoresist upon said layer of secondary material to expose said structure and a portion of said layer of primary material extending above the structure;
    forming, adjacent to each of the first and second opposing lateral sides of the structure, a recess having an opening remote from said semiconductor substrate and defined in part by one of the first and second opposing lateral sides of said structure and said layer of secondary material; and
    forming a cover layer, composed of a material selected from the group consisting of silicon nitride, silicon dioxide, and polysilicon, over said opening of each said recess without filling and of said recesses with said cover layer.

54. A method of making an electrically insulated structure, the method comprising:

providing an electrically conductive structure projecting from substrate and having two opposing sides;

forming a plurality of dielectric structures each projecting from one of the two opposing sides of the electrically conductive structure; and forming a dielectric layer over the electrically conductive structure, the plurality of dielectric structures, and the substrate such that a plurality of separate closed voids are formed between the electrically conductive structure and each said dielectric structure.

55. The method as defined in claim 54, wherein:

the substrate comprises a semiconductor substrate having a gate oxide thereon;

the electrically conductive structure comprises a gate stack; and the plurality of dielectric structures each comprise a spacer.

* * * * *

UNITED STATES PATENT AND TRADEMARK OFFICE
CERTIFICATE OF CORRECTION

PATENT NO. : 6,190,996 B1
DATED : February 20, 2001
INVENTOR(S) : Chandra V. Mouli and Fernando Gonzalez It is certified that error appears in the above-identified patent and that said Letters Patent is hereby corrected as shown below:

Title page,
Item [57], ABSTRACT,
Line 18, after "recess" change "isolate," to -- isolates --

Column 2,
Line 33, change "thick," to -- thick. --
Line 46, change "7.5." to -- 7.5, --

Column 3,
Line 3, after "having" delete ","
Line 46, after "example" insert -- , --
Line 48, after "within" delete "of"
Line 49, after "within" change "an" to -- a --
Line 61, change "that" to -- to illustrate --

Column 4,
Line 11, after "FIG. 1 with" insert -- a --

Column 5,
Line 56, delete "processes"

Column 6,
Line 12, after "selective to" insert -- the --
Line 49, after "primary" change "material" to -- material 24 --
Line 56, after "removes" delete "a"

Column 7,
Line 5, after "essentially" change "an" to -- a --
Line 13, after "air" change "to" to -- so --
Line 30, after "by" change "used" to -- use --

Column 9,
Line 2, before "oxide layer" insert -- gate --
Line 12, change "54" to -- 52 --
Line 16, after "composed" insert -- of --
Line 18, before "second" insert -- the --

UNITED STATES PATENT AND TRADEMARK OFFICE
CERTIFICATE OF CORRECTION

PATENT NO.   : 6,190,996 B1
DATED        : February 20, 2001
INVENTOR(S)  : Chandra V. Mouli; Fernando Gonzalez It is certified that error appears in the above-identified patent and that said Letters Patent is hereby corrected as shown below:

Column 12,
Line 40, after "method" change "sad" to -- as --

Column 14,
Line 24, before "layer" change "each" to -- gate --

Column 16,
Line 11, before "said recesses" insert -- the --

Column 17,
Line 42, after "has an" change "interlace" to -- interface --
Line 48, after "primary" insert -- material --

Column 18,
Line 17, change "structured," to -- structure, --
Line 36, after "part by" delete "the"

Column 19,
Line 7, before "substrate" insert -- a --

Signed and Sealed this

Twenty-first Day of January, 2003

JAMES E. ROGAN
*Director of the United States Patent and Trademark Office*